United States Patent [19]

Koo

[11] 4,048,518
[45] Sept. 13, 1977

[54] MOS BUFFER CIRCUIT

[75] Inventor: James T. Koo, Sunnyvale, Calif.

[73] Assignee: Intel Corporation, Santa Clara, Calif.

[21] Appl. No.: 754,119

[22] Filed: Dec. 27, 1976

Related U.S. Application Data

[62] Division of Ser. No. 656,935, Feb. 10, 1976, abandoned.

[51] Int. Cl.² .................... H03K 19/40; H03K 17/04
[52] U.S. Cl. .................................. 307/214; 307/205; 307/251; 307/DIG. 1; 307/DIG. 4
[58] Field of Search .............. 307/205, 214, 215, 246, 307/251, 264, DIG. 1, DIG. 4

[56] References Cited

U.S. PATENT DOCUMENTS

| | | | |
|---|---|---|---|
| 3,518,451 | 6/1970 | Booher | 307/205 X |
| 3,601,627 | 7/1970 | Booher | 307/205 |
| 3,676,700 | 7/1972 | Buchanan | 307/205 |
| 3,697,777 | 10/1972 | Donoghue | 307/251 X |
| 3,702,945 | 11/1972 | Faith et al. | 307/251 |
| 3,708,688 | 1/1973 | Yao | 307/DIG. 1 |
| 3,710,271 | 1/1973 | Putman | 307/205 X |
| 3,794,856 | 2/1974 | Baker | 307/205 |

Primary Examiner—John S. Heyman
Assistant Examiner—Larry N. Anagnos
Attorney, Agent, or Firm—Blakely, Sokoloff, Taylor & Zafman

[57] ABSTRACT

An MOS buffer circuit particularly suitable as an input stage for receiving a lower level input signal in an MOS integrated circuit. A transistor is employed to decouple an input transistor from a load, thereby allowing an output signal from the circuit to rise more quickly.

3 Claims, 3 Drawing Figures

MOS BUFFER CIRCUIT

This is a division of application Ser. No. 656,935, filed Feb. 10, 1976, now abandoned.

BACKGROUND OF THE INVENTION

1. Field of the Invention

The invention relates to the field of MOS buffer circuits, particularly inverters which convert lower level signals to higher level signals.

2. Prior Art

In metal-oxide-semiconductor (MOS) integrated circuits there is a frequent requirement to convert lower level signals to higher level signals. For example, a TTL or ECL input such as a clocking signal for an MOS memory, must be converted to a higher level signal compatible with MOS circuits. Such conversion must be performed at high speeds and ideally at low power levels.

Often in MOS circuits higher speed circuits are realized by fabricating larger devices which consume more power, thus higher speed is obtained at the cost of increased power. However, in an input inverter circuit, it is not generally possible to increase the speed of a circuit beyond a predetermined limit even if more power is consumed. That is, the circuit is "gain/bandwidth" limited. Specifically, assume that a load device is coupled in series with an input MOS field-effect transistor, the gate of which receives a lower level input signal such as a TTL level signal. It would appear that the rise time of a signal sensed at the load device (output node) could be substantially increased by reducing the impedance of this load device. However, in order to reduce this impedance the input transistor, of necessity, must become larger. This adds capacitance to the output node, thereby slowing the rise time of the output signal. With current production MOS n-channel processing, rise times at such nodes of approximately 40 nanoseconds are obtainable. In such circuits the decay time is generally not the limiting factor in determining the circuit speed since the large input transistor quickly pulls-down the output node.

In the invented circuit, the capacitance associated with the large input transistor is decoupled from the output node or line as the potential on this node rises. This permits substantial improvements in performance; rise times of approximately 11 nanoseconds have been obtained with current production n-channel processing.

SUMMARY OF THE INVENTION

An improved MOS inverter is described which includes an input transistor coupled in series with a load means. A decoupling transistor is coupled between the load means and the input transistor. The gate of this decoupling transistor is coupled to a controlled variable potential means for controlling the gate potential on the decoupling transistor. The potential on the gate of this transistor is controlled in response to a change of voltage on the gate of the input transistor. The voltage changes on the respective gates of the input transistor and the decoupling transistor cause the decoupling transistor to rapidly decouple the input transistor from the load means thereby allowing the output signal of the inverter to change more quickly.

DETAILED DESCRIPTION OF THE INVENTION

Figure 1:
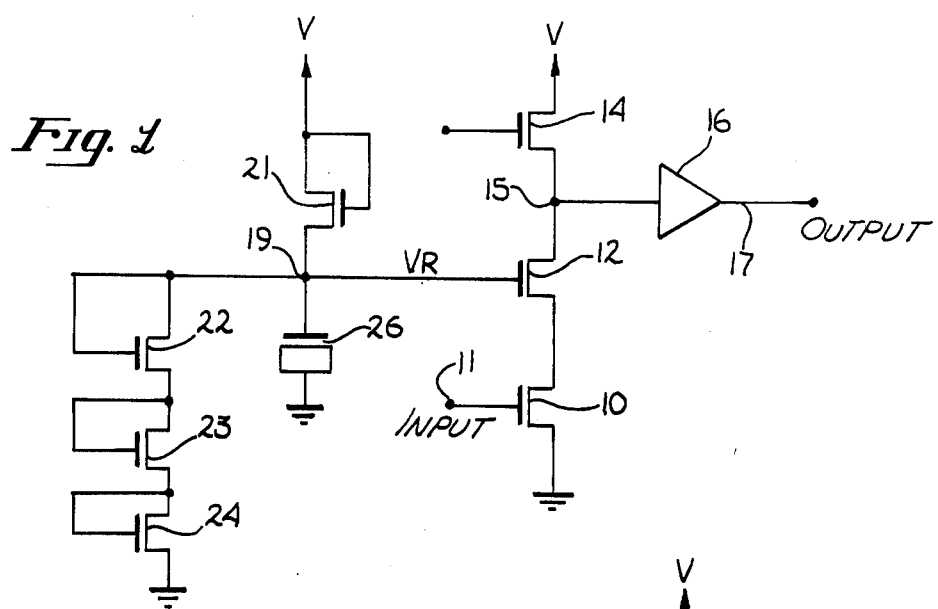
FIG. 1 is a schematic diagram illustrating a first embodiment of the invented circuit.

An MOS buffer circuit which is adaptable for use as an MOS integrated circuit input stage for converting a lower level signal to a higher level signal is described. The invented circuit shall be described in the form of an inverter employing n-channel field-effect transistors. Variations of the described embodiments will be apparent to one skilled in the art.

In the invented circuit a first or input transistor having its gate coupled to receive an input signal is coupled in series with a second or decoupling transistor. The decoupling transistor is coupled in series with a load means with the gate of this second transistor being coupled to a reference potential means. Referring to the embodiment of FIG. 1, a field-effect transistor 10 (input transistor) has its gate coupled to a line 11 for receiving a lower level input such as a TTL or ECL input signal. The drain terminal of transistor 10 is coupled to the source terminal of a field-effect transistor 12, referred to in this disclosure as a decoupling transistor since this transistor is employed for decoupling. The drain terminal of the decoupling transistor 12, node 15, is coupled to a load means which for the embodiment of FIG. 1 comprises a field-effect transistor 14. Node 15, the output node, is also coupled to the input of an amplifier 16, the output of which is shown in line 17. The drain terminal of the transistor 14 is coupled to a source of positive potential (V) for the described n-channel transistors. Thus, the circuit includes a load means and an input transistor innerconnected by the decoupling transistor 12.

The gate of the decoupling transistor 12, node 19, is maintained at a potential $V_R$ for the embodiment of FIG. 1. This potential is developed by a voltage divider circuit, comprising series transistors 21, 22, 23, and 24. The gate and drain terminal of transistor 21 are coupled to a source of positive potential (V) while the source terminal of transistor 21 and the gate and drain terminal of transistor 22 are coupled to node 19. The drain terminal and gate of transistor 23 are coupled to the source terminal of transistor 22, in a similar manner the drain terminal and gate of transistor 24 are coupled to the source terminal of transistor 23. A capacitor 26 is coupled between node 19 and ground Assume that a TTL signal is applied to the input line 11 of transistor 10 and that this signal is in its upper or more positive state. Transistor 10 will conduct coupling the source terminal of transistor 12 to ground. The gate of transistor 12 is maintained at approximately three voltages thresholds above ground by transistors 22, 23 and 24; thus when transistor 10 conducts, transistor 12 will likewise conduct. Assume further that a positive potential is applied to the load transistor 14 causing this transistor to conduct. For the described condition then, when the input signal is in its upper state, the output node 15 is in its lower state since this node is coupled to ground through transistors 12 and 10.

When the input signal on line 11 changes to its lower state, transistor 10 ceases to conduct. When this occurs, transistor 14 which is conducting begins to charge the parasitic capacitance associated with the large input transistor 10. When the potential on the source of transistor 12 (drain of transistor 10) exceeds two voltage thresholds above ground potential, trnsistor 12 ceases to conduct. The decoupling transistor 12 then decouples the large capacitance associated with transistor 10 from the output node 15, allowing transistor 14 to more rapidly charge node 15. Without the decoupling transistor 12, transistor 14 must fully charge the large capacitance associated with transistor 10, thereby slowing the rise in potential at the output node 15. The circuit of FIG. 1 may thus be used to convert a lower level input signal, such as TTL signal, to a higher level output signal which may vary between V and ground.

The rise in potential on node 15 will be coupled by parasitic capacitance to the gate of transistor 12 (node 19). This parasitic capacitance for this condition will tend to raise (in the positive sense) the potential on this gate thus inhibiting transistor 12 from decoupling node 15 from transistor 10. However, the capacitance 26 prevents a rapid rise in potential, thereby maintaining the gate of transistor 12 at a relatively constant potential determined by the voltage divider.

The circuit of FIG. 1 is in its presently preferred embodiment is realized as an integrated circuit with enhancement mode, n-channel transistors wherein transistor 10 has a channel width approximately 10 times greater than transistor 12. By way of example, the Z/1 ratios for transistors 10, 12 and 14 are 1500/5, 150/5 and 30/5, respectively.

Figure 2:
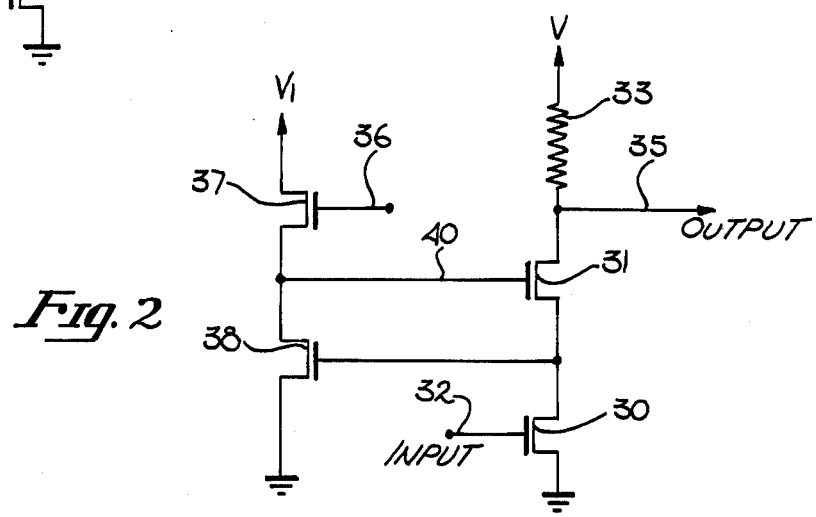
FIG. 2 is a schematic diagram illustrating another embodiment of the present invention wherein a transistor is employed for controlling the potential on the gate of the decoupling transistor.
Figure 3:
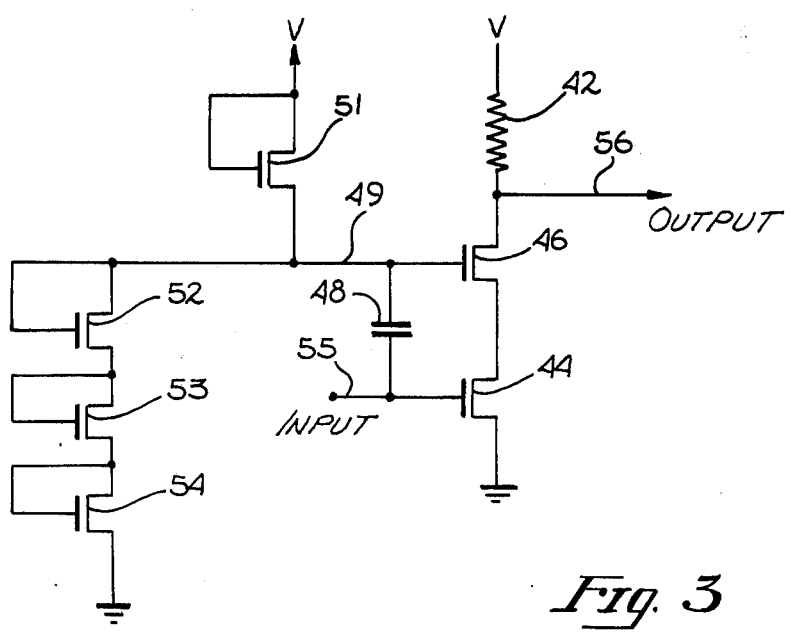
FIG. 3 is a schematic diagram illustrating still another embodiment of the present invention wherein a capacitor is coupled between the input line and the gate of the decoupling transistor.

For the embodiment of FIG. 1, a load means comprising a clocked field-effect transistor is illustrated. It will be apparent that other load means may be employed such as a depletion mode transistor, bootstraped enhancement mode transistor, or a resistor, such as is shown in the embodiments of FIGS. 2 and 3. Moreover, while in FIG. 1 a voltage divider is shown for providing the potential $V_R$ on the gate of decoupling transistor 12, other known means may be employed for maintaining this gate at a constant potential, or for otherwise controlling the potential on this gate. One circuit for controlling the potential on this gate shall be described in conjunction with the embodiment of FIG. 2.

Referring now to FIG. 2, in this embodiment a load means 33 which comprises a resistive means, resistor 33, is coupled to the output node 35 and to the drain terminal of the decoupling transistor 31. The source terminal of transistor 31 is coupled to the drain terminal of the input transistor 30 and to the gate of a field-effect transistor 38. The gate (line 32) of the input transistor 30 is coupled to receive the lower level input signal. The potential on the gate of transistor 31 (node 40) is controlled by transistors 37 and 38 which are coupled in series between a potential $V_1$ and ground. Node 40 is coupled to the common terminal between these transistors. The gate of transistor 37 is coupled to a line 36.

Assume for sake of explanation that a positive potential is periodically applied to line 36 such that node 40 is pre-charged to a predetermined potential from the potential $V_1$. When the input signal turns-off transistor 30, the potential on the source of transistor 31 (gate of transistor 38) begins to rise towards V. This rise in potential will cause transistor 38 to conduct, discharging node 40. The transistor 31 ceases to conduct, thereby decoupling the large parasitic capacitance associated with the input transistor 30 from the output node 35. This allows the potential on node 35 to rapidly rise to V.

For the embodiment of FIG. 2 note that the output signal on node 35 will not drop to ground potential when transistor 30 conducts unless node 40 has been charged through transistor 37. The circuit of FIG. 2 while requiring a clock signal on 36 has the advantage of providing higher speeds when compared to the circuit of FIG. 1. This circuit may also be employed as a latch or edge sensor and is particularly suitable for sensing a write command in memory.

In FIG. 3 an input transistor 44 is coupled in series with a decoupling transistor 46. Transistor 46 is coupled to the potential V through resistor 42. The gate of transistor 46, node 49, is maintained at a reference potential by a voltage divider circuit which comprises transistor 51, 52, 53 and 54 coupled in series between V and ground. The source terminal of transistor 51 along with the gate and drain terminal of transistor 52 are coupled to node 49. Node 49 is coupled to the input line 55 by a capacitor 48.

For the embodiment of FIG. 3, when transistor 44 conducts node 56 is brought to ground potential in the same manner as with the previously described embodiments. However, when transistor 44 is turned-off, that is, when the potential on line 55 drops, this drop in potential is coupled by capacitor 48 to the gate decoupling transistor 46. This drop in potential causes the decoupling transistor to more rapidly cease conducting, when compared to the embodiment of FIG. 1. This, in turn, allows node 56 to more rapidly rise in potential. In the embodiment of FIG. 3 care must be taken to assure that node 49 is not pulled too low. If this occurs transistor 31 may initially turn-off, and then turn-on if the potential on the source of transistor 46 has not risen sufficiently to prevent this transistor from conducting.

Thus, an MOS buffer circuit particularly suitable as an input stage to an MOS integrated circuit has been disclosed. The circuit may be used to convert a lower level TTL input signal to a higher level MOS signal.

I claim:

1. In an MOS inverter which includes an input transistor coupled in series with a load means, an improvement comprising:
    a decoupling transistor coupled between said load means and said input transistor;
    the gate of said decoupling transistor being coupled to a controlled variable potential means for controlling the gate potential of said decoupling transistor in response to a change of voltage on the gate of said input transistor;
    whereby the voltage changes on the respective gates of said input transistor and said decoupling transistor together cause said decoupling transistor to rapidly decouple said input transistor from said load means, thereby allowing the output signal from said inverter to charge more quickly.

2. An MOS circuit for providing an output signal in response to an input signal comprising:
    load means coupled to a source of potential;
    a decoupling transistor coupled to said load means;
    an input transistor coupled to said decoupling transistor, the gate of said input transistor being coupled to receive said input signal; and,
    control means for controlling the potential on the gate of said decoupling transistor comprising, a first transistor having its gate coupled to the common terminal between said input transistor and said decoupling transistor, and one of its terminals coupled to said gate of said decoupling transistor;

whereby said decoupling transistor decoupled capacitance associated with said input transistor thereby permitting said output signal of said circuit to rise more quickly.

3. The MOS circuit defined by claim 2 wherein said control means includes charging means for charging said gate of said decoupling transistor.

* * * * *